(12) United States Patent
Han

(10) Patent No.: US 8,064,258 B2
(45) Date of Patent: *Nov. 22, 2011

(54) METHOD APPARATUS, AND SYSTEM PROVIDING ADJUSTABLE MEMORY PAGE CONFIGURATION

(75) Inventor: Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 200 days.

This patent is subject to a terminal disclaimer.

(21) Appl. No.: 12/468,723

(22) Filed: May 19, 2009

(65) Prior Publication Data

US 2009/0225598 A1    Sep. 10, 2009

Related U.S. Application Data

(63) Continuation of application No. 11/511,451, filed on Aug. 29, 2006, now Pat. No. 7,548,459.

(51) Int. Cl.
*G11C 16/06*    (2006.01)

(52) U.S. Cl. ............... 365/185.09; 365/200; 365/230.06
(58) Field of Classification Search ............. 365/185.09, 365/200, 230.06
See application file for complete search history.

(56) References Cited

U.S. PATENT DOCUMENTS

| | | | |
|---|---|---|---|
| 6,813,199 B2 * | 11/2004 | Hidaka | 365/200 |
| 6,868,022 B2 * | 3/2005 | Scheuerlein et al. | 365/201 |
| 6,996,017 B2 * | 2/2006 | Scheuerlein et al. | 365/201 |
| 7,403,417 B2 | 7/2008 | Cohen | |
| 7,548,459 B2 * | 6/2009 | Han | 365/185.09 |
| 7,779,334 B2 * | 8/2010 | Earle et al. | 714/763 |
| 2003/0043651 A1 | 3/2003 | Kojima et al. | |
| 2007/0121396 A1 | 5/2007 | Nitzan et al. | |
| 2009/0259799 A1 * | 10/2009 | Wong | 711/103 |

* cited by examiner

*Primary Examiner* — Pho M Luu
(74) *Attorney, Agent, or Firm* — Dickstein Shapiro LLP

(57) ABSTRACT

A method, apparatus and system providing a memory device having an array of cells which may be selectively designated for either error correction code use or redundancy cell use.

20 Claims, 4 Drawing Sheets

METHOD APPARATUS, AND SYSTEM PROVIDING ADJUSTABLE MEMORY PAGE CONFIGURATION

This application is a continuation of application Ser. No. 11/511,451, filed Aug. 29, 2006, now U.S Pat. No. 7,548,459, issued Jun. 16, 2009, which is hereby incorporated herein by reference in its entirety.

FIELD OF THE INVENTION

This disclosure relates generally to memory devices, and more particularly to a memory device with an adjustable page configuration.

BACKGROUND OF THE INVENTION

Memory can generally be characterized as either volatile or non-volatile. Volatile memory, for example, most types of random access memory (RAM), requires constant power to maintain stored information. Non-volatile memory does not require power to maintain stored information. Various types of non-volatile memories include read only memories (ROMs), erasable programmable read only memories (EPROMs), and electrically erasable programmable read only memories (EEPROMs).

Flash memory is a type of EEPROM that is programmed and erased in blocks as opposed to cells. The "NAND" and "NOR" architectures are two common types of flash memory architectures. A NAND flash device typically utilizes a NAND Flash controller to write data to the NAND flash device page by page. Pages are typically grouped into blocks, where a block is the smallest erasable unit. For example, and without limitation, a typical memory device contains 2,112 bytes of memory per page and 128 pages of memory are contained in a block. The smallest entity that can be programmed is a byte.

A typical 2 gigabyte (Gb) NAND flash device is organized into 2,048 blocks. Each block contains 64 pages. Each page has 2,112 bytes total, comprised of a 2,048-byte data area and a 64-byte spare area. The spare area is typically used for error correction code (ECC), redundancy cells, and/or other software overhead functions.

FIG. 1 shows a typical page configuration for a NAND flash memory 10. Memory cells 5 are arranged in rows and columns in a memory array 15. The memory array 15 is partitioned into two arrays, a main array 20 and a spare array, e.g., a column redundancy array 50. Memory cells 5 in the main array 20 are used for storing user data 22 and ECC bytes 24. Memory cells 5 in the column redundancy array 50 are invisible to the user and are used for replacing malfunctioning cells. A decoder 30 decodes addresses from an address bus 65 to generate select signals 40 for the main array 20, and a redundancy decoder 60 decodes addresses to generate redundancy enable signals 70 for the column redundancy array 50.

As NAND technology progresses, memory cell sizes shrink. Likewise, error rates increase, due in part to the smaller cell sizes and the trend towards storing multiple bits of data on a cell as opposed to a single data bit on a cell. To address the increasing error rate problem, stronger ECC algorithms are required to correct more failed bits occurring on a page. A stronger ECC requires more available ECC bytes on a page. Currently, there is no established industry standard regarding the implementation of ECC algorithms for NAND flash memories. ECC implementations vary from application to application, accordingly, the number of bytes required for the various ECC algorithms also varies. In order to accommodate the large range of potential ECC algorithms, memory chip designers are forced to include memory areas for storing the maximum number of ECC bytes per page. However, these extra ECC bytes on a page required for a particular algorithm may not be necessary for another algorithm. The inclusion of memory areas for storing the maximum number of ECC bytes in a chip leads to a waste of valuable chip size for the chips employing algorithms requiring less bytes. On the other hand, a designer making an economical estimate on the required number of ECC bytes may select a number too conservatively, resulting in a chip without enough bytes required for a given algorithm and preventing the implementation of a desired ECC method in the chip all together. Accordingly, there is a desire and a need for a new memory configuration which addresses the aforementioned problems.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

Figure 1:
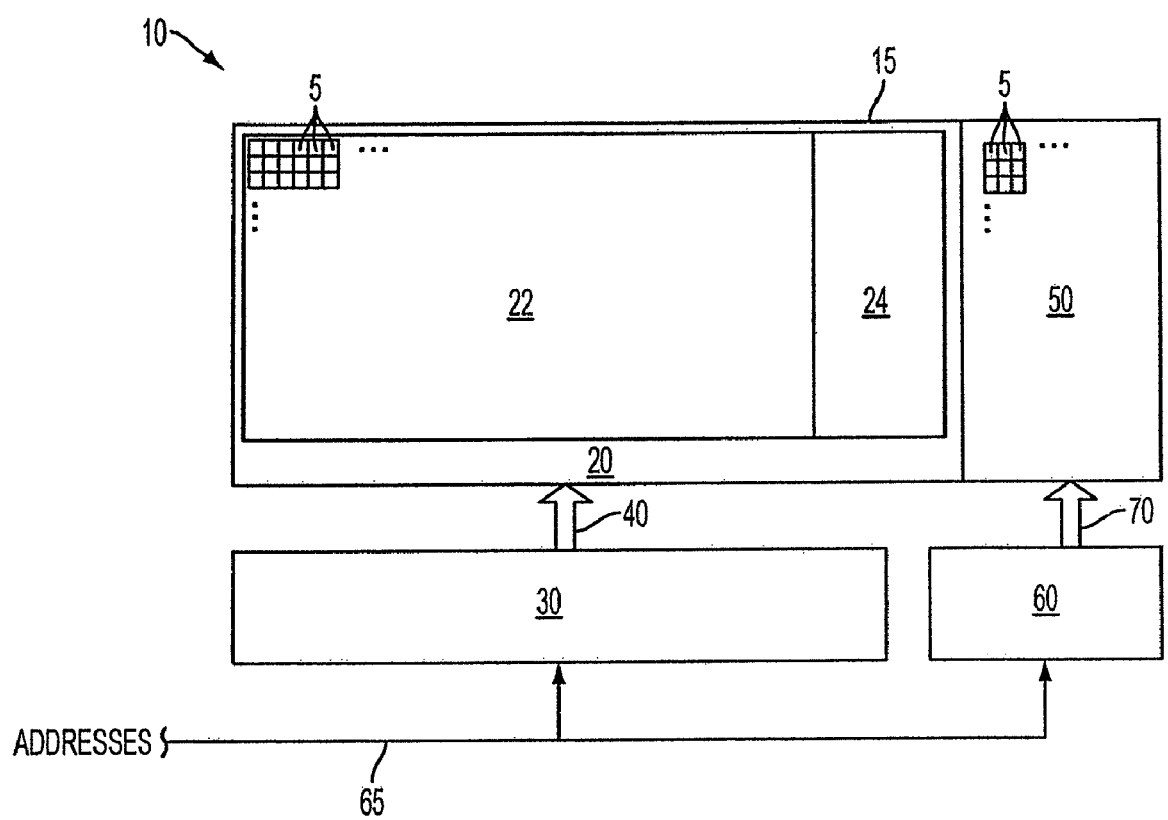
FIG. 1 illustrates a block diagram of a conventional NAND flash memory page configuration.
Figure 2:
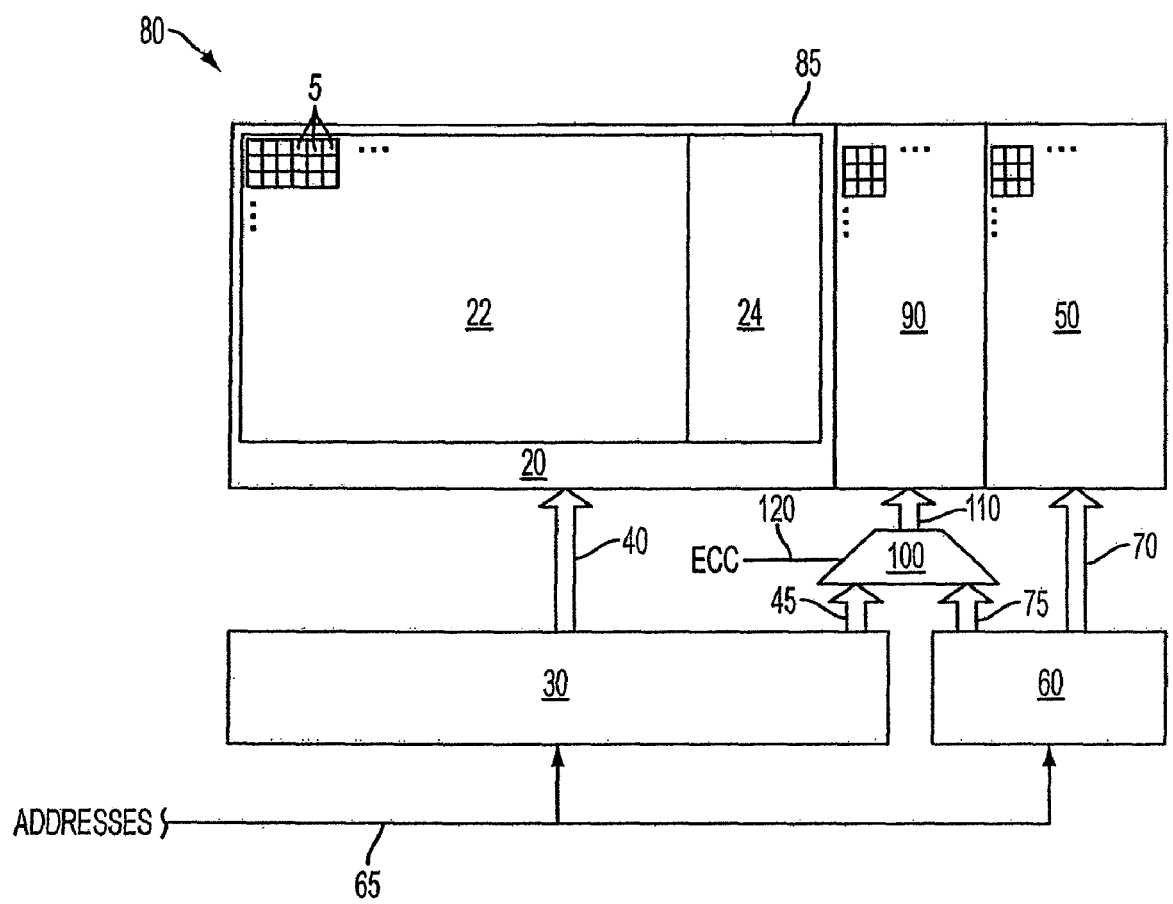
FIG. 2 illustrates a block diagram of a NAND flash memory page configuration according to an embodiment of the invention.

FIG. 2 shows an embodiment of a page configuration for a page-based memory device, for example, NAND flash memory, capable of accommodating varying ECC and redundancy byte requirements according to the present invention. A memory array 85 is partitioned into a main array 20, a column redundancy array 50, and an additional cells array 90. Memory cells 5 in the main array 20 are used for storing user data 22 and ECC bytes 24. Memory cells 5 in the column redundancy array 50 are used for replacing malfunctioning cells. Memory cells 5 in the additional cells array 90 may be designated for use as either additional ECC bytes or additional column redundancy cells. The additional cells array 90 designation is controlled by the output of a multiplexer 100. The main decoder 30 and the column redundancy decoder 60 send channel signals 45 and 75, respectively, to the multiplexer 100. A select signal 120 is used to select which channel will be presented to the output 110 of the multiplexer 100. For example, as illustrated, the channel select signal 120 is set to ECC. Accordingly, a decoded address signal 45 from the main array 30 is sent through the multiplexer as output 110 and the cells 5 in the additional cells array 90 are designated for use as additional ECC bytes. Memory array 85 is not limited to fixed amounts of redundancy cells and ECC bytes. By controlling which decoded address signal is sent to the additional cells array 90, ECC bytes or column redundancy cells may be augmented as needed.

The select signal 120 may be controlled at various operating levels, such as at a user-level, an operating system level or a manufacturer level. Since redundancy cell needs are typically determined at the manufacturing level, the additional cells array 90 designation may be set exclusively as part of a preset manufacturing setting.

Figure 3A:
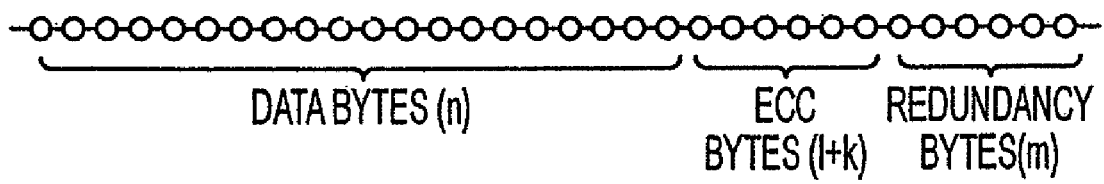
FIG. 3A illustrates additional cells allocated for use as additional ECC bytes in a NAND flash memory page according to an embodiment of the invention.
Figure 3B:
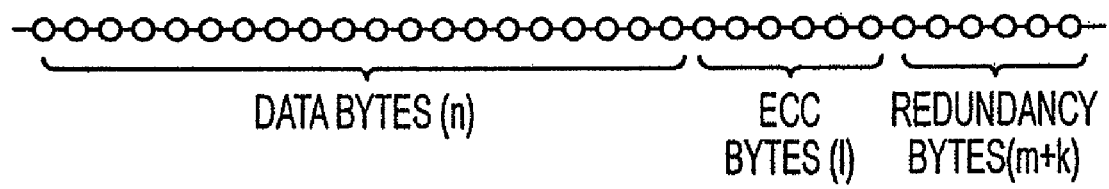
FIG. 3B illustrates additional cells allocated for use as additional redundancy cells in a NAND flash memory page according to an embodiment of the invention.

FIG. 3 shows an example of a page configuration of NAND flash memory according to the invention. The total number of bytes is equal to the data bytes (n)+redundancy bytes (m)+ECC bytes (l)+additional bytes (k). The total number of redundancy bytes (m) or ECC bytes (l) available depends on the designation of the additional bytes (k). FIG. 3A shows a configuration in which the additional cells array 90 is designated for use as additional ECC bytes. The total number of ECC bytes (l) available is equal to ECC bytes (l)+additional bytes (k). FIG. 3B shows a page configuration in which the variable array is designated for use as additional redundancy bytes. The total number of redundancy bytes (l) available is equal to redundancy bytes (m)+additional bytes (k). In this manner additional ECC bytes may be made available as needed for stronger ECC algorithms, or additional redundancy bytes may be made available when implementing a weaker ECC algorithm.

Figure 4:
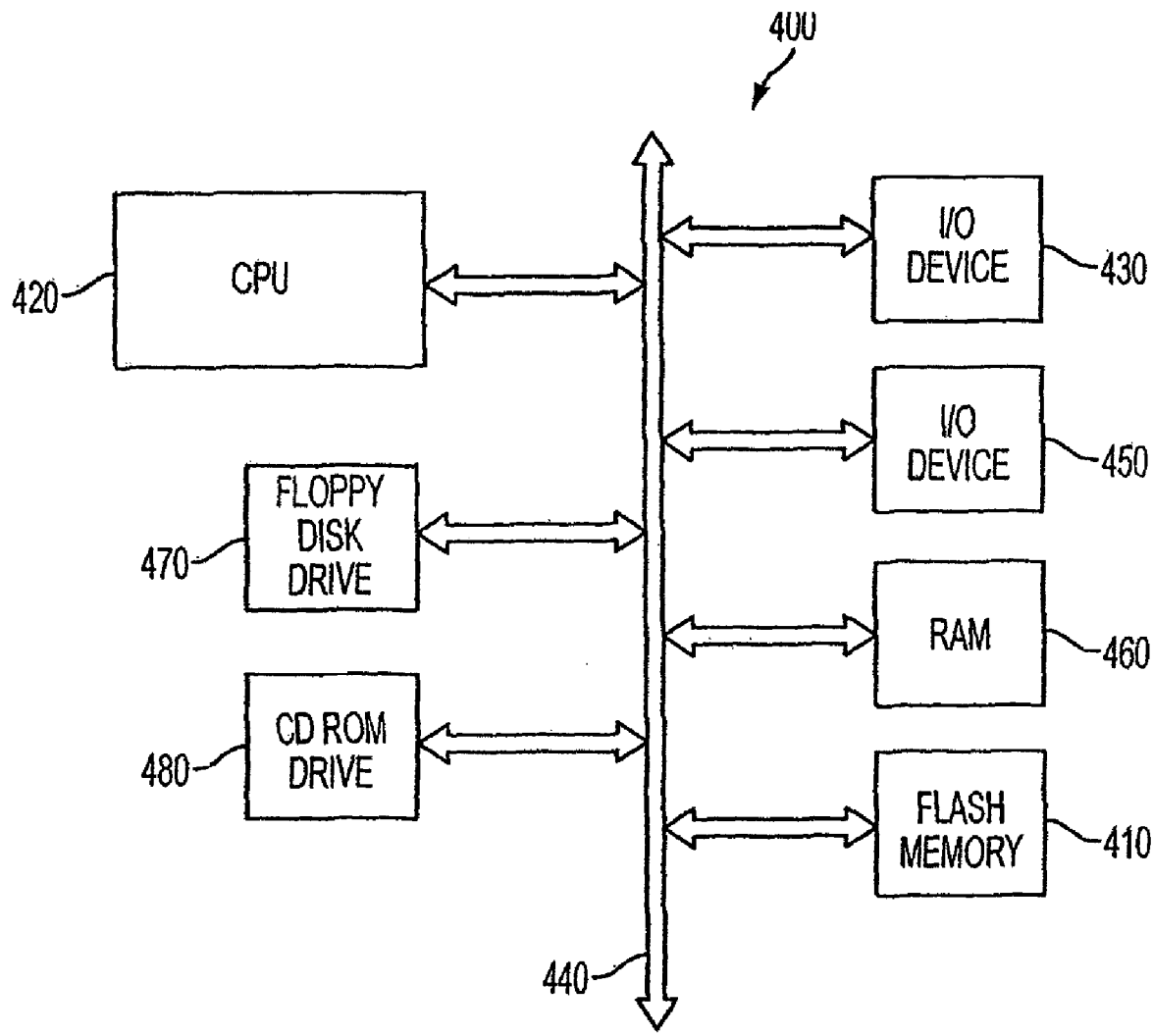
FIG. 4 illustrates a system incorporating a NAND flash memory device in accordance with the invention

FIG. 4 is a block diagram of a processing system 400 utilizing a memory device, e.g., a flash memory device 410, constructed in accordance with an embodiment of the present invention. The system 400 may be a computer system, a process control system, camera system or any other system employing a processor and associated flash memory. The system 400 includes a central processing unit (CPU) 420, e.g., a microprocessor, that communicates with the flash memory device 410 and an I/O device 430 over a bus 440. It must be noted that the bus 440 may be a series of buses and bridges commonly used in a processor system, but for convenience purposes only, the bus 440 has been illustrated as a single bus. A second I/O device 450 is illustrated, but is not necessary to practice the invention. The processor system 400 may also include random access memory (RAM) device 460 and may include a read-only memory (ROM) device (not shown), and peripheral devices such as a floppy disk drive 470 and a compact disk (CD) ROM drive 480 that also communicate with the CPU 420 over the bus 440 as is well known in the art.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications, permutations and variations as fall within the scope of the appended claims.

What is claimed as new and desired to be protected by Letters Patent of the United States is:

1. A memory device, comprising:
an array of memory cells, said array partitioned into at least an error correction code area, user-accessible memory area, a redundancy cell area, and an additional area which can be configured as an additional error correction code area or additional redundancy area.
2. The memory device of claim 1 further comprising:
a main decoder for decoding addresses to generate select signals connected to the user-accessible memory area and error correction code area; and
a redundancy decoder for decoding addresses to generate select signals for the redundancy cell area.
3. The memory device of claim 2 wherein the additional area is set by said select signal for error correction code use.
4. The memory device of claim 2 wherein the additional area is set by said select signal for redundancy cell use.
5. The memory device of claim 2 wherein the memory device is a non-volatile memory device.
6. The memory device of claim 5 wherein said non-volatile memory device is a flash memory device.
7. The memory device of claim 6 wherein said array is a page of said flash memory device.
8. The memory device of claim 6 wherein said additional area is set by said select signal for error correction code use.
9. The memory device of claim 6 wherein said additional area is set by said select signal for redundancy cell use.
10. The memory device of claim 2 where the additional area is set by said select signals for error correction code use or for redundancy cell use based on a need for additional error correction code cells or redundancy cells.
11. A memory device, comprising:
an array of memory cells, said array being partitioned at least into an additional cells array, wherein an amount of cells in the additional cells array can be configured based on a strength of an error correction algorithm.
12. The memory device of claim 11, wherein the array of memory cells is further partitioned into at least an error correction code cell array, a user-accessible memory cell array, and a redundancy cell array.
13. The memory device of claim 12, wherein the amount of cells in the additional cells array can be configured as additional error correction code cells or as additional redundancy cells.
14. The memory device of claim 12 further comprising:
a main decoder for decoding addresses to generate select signals connected to the user-accessible memory area and error correction code area;
a redundancy decoder for decoding addresses to generate select signals for the redundancy cell area; and
a multiplexer for receiving a first input from said main decoder, a second input from said redundancy decoder and a settable select input, said multiplexer being controlled to output a signal from the first or second inputs to said additional area.
15. A method of operating a memory device having a memory cell array comprising an additional cells array, said method comprises configuring an amount of cells in the additional cells array based on a strength of an error correction algorithm.
16. The method of claim 15, further comprising configuring the amount of cells in the additional cells array as additional error correction code cells or as additional redundancy cells.
17. The method of claim 15, wherein the memory device is a non-volatile memory device.
18. The method of claim 15, wherein said non-volatile memory device is a flash memory device.
19. The method of claim 17, wherein said non-volatile memory device is a NAND flash memory device.
20. The method of claim 17, wherein said non-volatile memory device is a NOR flash memory device.

* * * * *

UNITED STATES PATENT AND TRADEMARK OFFICE
CERTIFICATE OF CORRECTION

| | | |
|---|---|---|
| PATENT NO. | : 8,064,258 B2 | Page 1 of 1 |
| APPLICATION NO. | : 12/468723 | |
| DATED | : November 22, 2011 | |
| INVENTOR(S) | : Han | |

It is certified that error appears in the above-identified patent and that said Letters Patent is hereby corrected as shown below:

On the Title page, in Item (54), in "Title", in column 1, line 1, delete "METHOD" and insert -- METHOD, --, therefor.

In column 1, line 1, delete "METHOD" and insert -- METHOD, --, therefor.

In column 1, line 6, delete "U.S" and insert -- U.S. --, therefor.

In column 4, line 58, in Claim 18, delete "claim 15," and insert -- claim 17, --, therefor.

Signed and Sealed this
Seventeenth Day of January, 2012

David J. Kappos
*Director of the United States Patent and Trademark Office*